United States Patent
Kitani

(10) Patent No.: US 7,510,740 B2
(45) Date of Patent: Mar. 31, 2009

(54) METHOD FOR MAKING PIEZOELECTRIC ELEMENT

(75) Inventor: Koji Kitani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 653 days.

(21) Appl. No.: 10/728,953

(22) Filed: Dec. 8, 2003

(65) Prior Publication Data

US 2004/0121084 A1  Jun. 24, 2004

(30) Foreign Application Priority Data

Dec. 19, 2002 (JP) ............................. 2002-368250

(51) Int. Cl.
- *B05D 5/12* (2006.01)
- *B05D 1/04* (2006.01)
- *H01L 41/22* (2006.01)

(52) U.S. Cl. .................. 427/100; 427/458; 427/475; 427/483; 427/561; 427/255.33; 427/255.35; 29/25.35

(58) Field of Classification Search .................. 427/100, 427/255.32, 255.34, 255.35, 421.1, 458, 427/475, 483, 561; 29/25.35

See application file for complete search history.

(56) References Cited

U.S. PATENT DOCUMENTS

| | | | | |
|---|---|---|---|---|
| 4,500,397 A | * | 2/1985 | Mori | 204/487 |
| 5,377,429 A | * | 1/1995 | Sandhu et al. | 34/586 |
| 6,153,268 A | * | 11/2000 | Huggins | 427/475 |
| 6,562,200 B2 | | 5/2003 | Iwase et al. | 204/192.12 |

FOREIGN PATENT DOCUMENTS

| | | | |
|---|---|---|---|
| JP | 49-022119 | * | 6/1974 |
| JP | 06-285063 | | 10/1994 |
| JP | 11-330577 | | 11/1999 |
| JP | 11-334066 | | 12/1999 |
| JP | 2001-152360 | | 6/2001 |

\* cited by examiner

*Primary Examiner*—Brian K Talbot
(74) *Attorney, Agent, or Firm*—Fitzpatrick, Cella, Harper & Scinto

(57) ABSTRACT

A method for making a piezoelectric element including a piezoelectric film formed on a substrate by a gas deposition technique includes the steps of ejecting ultra-fine particles of a piezoelectric material having a perovskite structure from an ejecting device toward the substrate, and applying an electric field to the ultra-fine particles traveling to the substrate. The substrate may be composed of a metal or a resin.

5 Claims, 1 Drawing Sheet

METHOD FOR MAKING PIEZOELECTRIC ELEMENT

BACKGROUND OF THE INVENTION

1. Field of the Invention

The present invention relates to a method for making a piezoelectric element, and more particularly, to a method for making a piezoelectric element using a gas deposition technique.

2. Description of the Related Art

Piezoelectric elements have the piezoelectric effect in which an electric field is generated by strain and the reverse piezoelectric effect in which strain is caused by the application of an electric field. As the piezoelectric material, lead zirconate titanate (hereinafter abbreviated as "PZT") to which various trace metals, such as strontium and barium, are added is mainly used. Conventionally, piezoelectric elements are produced by a method including mixing of raw material powders, compression, sintering, machining, application of an electrode material, and polarizing treatment to impart piezoelectric properties.

With the recent miniaturization of devices, it is becoming necessary to mount piezoelectric elements on thinner, smaller spots. Since oxide-based piezoelectric materials, such as PZT, are brittle, there is a limit to a decrease in the thickness of the piezoelectric elements produced using such piezoelectric materials. It is difficult to decrease the thickness to about 0.1 mm or less. In the high-frequency bands, the loss from adhesives must also be taken into consideration. Therefore, in order to prepare piezoelectric films for producing thinner piezoelectric elements without including a bonding step, various film deposition methods, such as gas deposition techniques, hydrothermal synthesis, and sol-gel processes, have been invented, and piezoelectric elements using the piezoelectric films prepared by these methods have been manufactured by way of trial. Among these methods, in view of forming so-called "thick films" of several micrometers to several tens of micrometers, gas deposition techniques are receiving attention.

An apparatus for producing piezoelectric elements using a gas deposition technique includes at least an ultra-fine particle-floating chamber, a film-forming chamber, and a transport pipe. The gas deposition technique is a dry method for forming films, in which ultra-fine particles generated or prepared in the ultra-fine particle-floating chamber are introduced into the film-forming chamber through the transport pipe by a carrier gas, such as an inert gas, and are sprayed at a high speed from a nozzle to directly draw a pattern.

Ultra-fine particles may be, for example, generated in the ultra-fine particle-floating chamber by heating and vaporizing the raw materials in an inert gas using arc heating, resistance heating, or the like. Alternatively, ultra-fine particles of PZT or the like prepared in advance may be used. Ultra-fine particles with an average particle size of 0.1 to 1 µm are usually used. The ultra-fine particles are used, for example, in a dry method for forming films, in which a carrier gas containing the ultra-fine particles or the ultra-fine particles placed in the ultra-fine particle-floating chamber and floated by a carrier gas are introduced into the film-forming chamber through the transport pipe, for example, using a differential pressure between the pressure in the ultra-fine particle-floating chamber and the pressure in the film-forming chamber. By spraying from the nozzle at a high speed, a pattern is directly drawn on a substrate or the like.

The gas deposition technique is characterized in that the film deposition rate is higher and film deposition temperature is lower compared with sol-gel processes or hydrothermal synthesis. Since ultra-fine particles have smaller particle sizes than those of ordinary fine particles, they have very large specific surface areas and become highly active. The ultra-fine particles are bonded with each other by collision energy with the substrate, and thereby a piezoelectric film is formed. For example, Japanese Patent Laid-Open No. 6-285063 (patent document 1), No. 11-334066 (patent document 2), No. 11-330577 (patent document 3), and No. 2001-152360 (patent document 4) disclose methods for making piezoelectric elements, in which piezoelectric films are formed by gas deposition techniques, electrodes are applied to the films, and then polarizing treatment is performed.

A mechanism in which PZT exhibits piezoelectric properties will be briefly described below. In the crystal structure (perovskite structure) of PZT, there is a misalignment in the center of mass between the positively charged and negatively charged ions. The misalignment results in an electric dipole. PZT has spontaneous polarization and exhibits piezoelectric properties.

In the PZT grains, domains with sizes of 0.2 to 0.4 µm are formed, and each domain has a spontaneously polarized electric dipole and has piezoelectric properties. In the conventional process of forming a PZT piezoelectric film, a polycrystalline sintered compact is produced. Since the crystal axes of the individual crystal grains are randomly aligned, the spontaneous polarizations of the domains in the individual crystal grains are also randomly oriented. Therefore, the electric dipoles of the individual domains cancel each other out overall, and the piezoelectric properties of the sintered compact disappear. In order to impart piezoelectric properties to the sintered compact, it is necessary to carry out a step of aligning the orientations of the spontaneous polarizations of the individual domains (polarizing step).

Polarizing conditions in the polarizing step vary depending on the compositions of PZT. In general, an electric field of 1 to 5 kV/mm is applied for 30 minutes to 1 hour at 100° C. to 150° C. In the polarizing step, by applying the electric field under the conditions described above, the electric dipoles in the domains of the individual crystal grains are aligned in a certain direction. Since the sintered compact is polycrystalline, and the individual crystal grains physically stick to the adjacent crystal grains, the crystal grains are gradually deformed by applying heat over a certain period of time so that the orientations of the electric dipoles of the individual crystal grains are displaced.

Accordingly, in the methods for producing piezoelectric elements which include polarizing treatment, various steps, such as heating, voltage application, and cleaning, are required, and also, since strain is caused due to the alignment of the electric dipoles, dimensional accuracy is degraded.

Hydrothermal synthesis is known as a film deposition method without including polarizing treatment. However, due to the drawbacks, such as low deposition rate and residual solvent, it has been confirmed that hydrothermal synthesis is not suitable for forming piezoelectric thick films.

SUMMARY OF THE INVENTION

It is a main object of the present invention to provide a method for making a piezoelectric element in which a piezoelectric thick film is formed by a gas deposition technique without including a polarizing step.

It is another object of the present invention to provide a method for making a piezoelectric element in which a piezoelectric film is formed on a substrate by a gas deposition technique, the method including the steps of ejecting ultra-fine particles of a piezoelectric material having a perovskite structure from an ejecting device toward the substrate, and applying an electric field to the ultra-fine particles traveling to the substrate.

If a piezoelectric element including a piezoelectric material, such as PZT, is produced by a sintering method, crystal axes of the crystal grains are randomly oriented and piezoelectric properties are not exhibited. Therefore, polarizing treatment must be carried out in order to impart piezoelectric properties to the piezoelectric element. In contrast, in the method of the present invention, in view of the fact that ultra-fine particles of a piezoelectric material having the perovskite structure have spontaneous polarization, in a gas deposition technique in which a piezoelectric film is directly formed on a substrate using a piezoelectric material having the perovskite structure, by applying an electric field to the ejected ultra-fine particles, the electric dipoles of the ultra-fine particles were aligned. Thereby, it is possible to produce a piezoelectric element by forming a piezoelectric thick film having piezoelectric properties without including polarizing treatment. For example, a PZT thick film having piezoelectric properties can be formed directly on a substrate composed of a low-melting-point resin without performing polarizing treatment.

In accordance with the present invention, since polarizing treatment is not required after the piezoelectric film is formed, a polarizing step at high temperatures can be eliminated, and consequently, strain and stress which are unavoidable in the polarizing treatment do not occur. Therefore, it is possible to provide piezoelectric elements with high dimensional accuracy and also to provide piezoelectric actuators, sensors, etc., using the piezoelectric elements.

Further objects, features and advantages of the present invention will become apparent from the following description of the preferred embodiments with reference to the attached drawings.

DESCRIPTION OF THE PREFERRED EMBODIMENTS

An embodiment of the present invention will be described based on an example.

Figure 1:
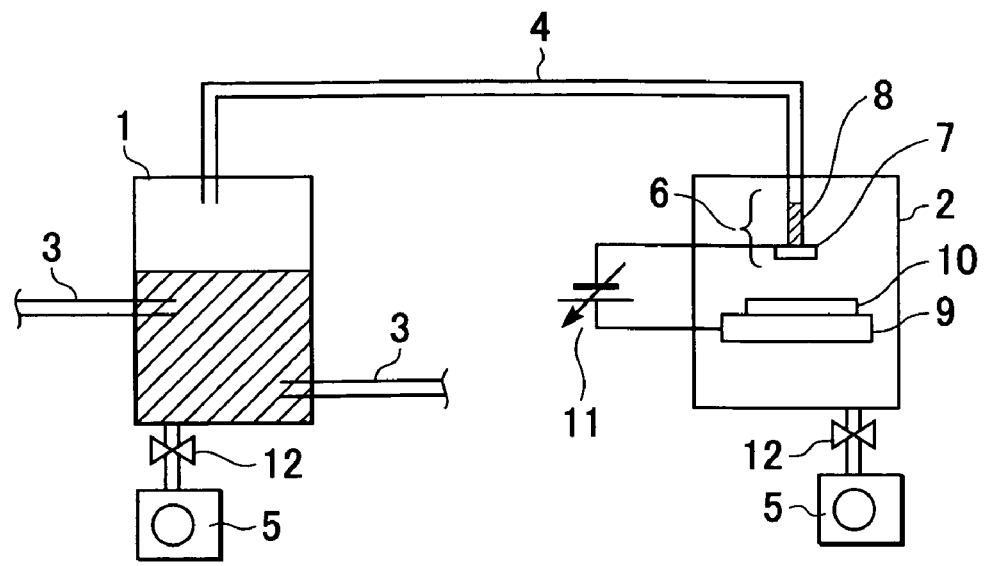
FIG. 1 is a schematic diagram which shows a structure in an embodiment of the present invention.

Referring to FIG. 1, sintered powder of PZT ultra-fine particles having the perovskite structure with an average particle size of 0.8 μm is fed into an ultra-fine particle-floating chamber 1. In the ultra-fine particle-floating chamber 1, the ultra-fine particles are stirred by a carrier gas (Ar or the like) introduced from carrier gas inlet pipes 3, and the ultra-fine particles are floating in the carrier gas. Although two inlet pipes 3 are shown in FIG. 1, one inlet pipe may be acceptable, or the number of inlet pipes may be further increased to improve the controllability of floating particles. The ultra-fine particle-floating chamber 1 is communicated with a film-forming chamber 2 by a transport pipe 4. The pressure of the ultra-fine particle-floating chamber 1 and the pressure of the film-forming chamber 2 are controlled by the independently controllable exhaust systems 5 including valves 12 so as to produce a differential pressure. In this example, the differential pressure was set at 500 Torr. The ultra-fine particles floating in the ultra-fine particle-floating chamber 1 together with the carrier gas were introduced into the film-forming chamber 2 through the transport pipe 4, and are sprayed from a nozzle 6 at a high speed.

The nozzle 6 includes a conductive nozzle tip 7 which is insulated by an insulating joint 8 composed of aluminum or the like. A DC voltage can be applied to the nozzle tip 7 by an external power 11. In the present invention, the intensity of the applied electric field is preferably in the range of 0.5 to 3 kV/mm, and more preferably in the range of 1 to 2 kV/mm. In this example, the external power 11 was connected so that the nozzle tip 7 is negative in relation to a substrate 10. The nozzle tip 7 is preferably composed of a superhard material (e.g., tungsten carbide) with cobalt as a binder so that abrasion is prevented and conductivity is ensured. The outside diameter of the nozzle tip 7 is 20 mm. An ejecting port with a diameter of 0.8 mm is provided in the center of the nozzle tip 7. The surface of the nozzle tip 7 provided with the ejecting port is planarized by polishing.

A stage 9 having ground potential which operates horizontally is placed in the film-forming chamber 2 so that the upper surface of the stage 9 is exactly parallel to the surface of the nozzle tip 7. Any substrate may be used as the substrate 10. In this example, a substrate composed of stainless steel (SUS) with a thickness of 0.3 mm was used as the substrate 10. The temperature of the film-forming chamber 2 was set at room temperature. The substrate 10 and the stage 9 were electrically and mechanically coupled with each other, and by operating the stage 9, lines were drawn on the substrate 10 using PZT ultra-fine particles.

The material and conditions used in this example were as follows.

Sintered powder of PZT: N-61 (Trade name) manufactured by NEC TOKIN Corporation (sintered and pulverized by milling)

Stage operating rate: 100 μm/s

Distance between nozzle tip 7 and substrate 10: 4.7 mm

Potential at nozzle tip 7: −15 kV

The line width of each line was 0.8 to 1.0 mm. The film thickness measured by a stylus-type thicknessmeter was about 160 μm. By moving the stage 9 in the line width direction by 0.7 mm and repeating the drawing 10 times, the SUS substrate provided with a PZT film with a width of 7 mm and a length of 10 mm was prepared.

In order to examine the electrical characteristics, a Ni film with a thickness of 1 μm was formed by plating on the PZT film, and using silver wire of 0.1 mm, electrode leads were attached to the Ni film and the SUS substrate. A piezoelectric element was thereby produced. With respect to the piezoelectric element, resonance frequency characteristic was examined by measuring impedance. A peak of impedance occurred at a resonance frequency of 240 kHZ in the lengthwise vibration mode in the longitudinal direction of the piezoelectric element. The relative dielectric constant calculated based on the thickness and capacitance of the piezoelectric element was about 1,100. Since the peak occurs in the impedance measurement, the PZT film of the piezoelectric element in this example is thought to be polarized.

Figure 2:
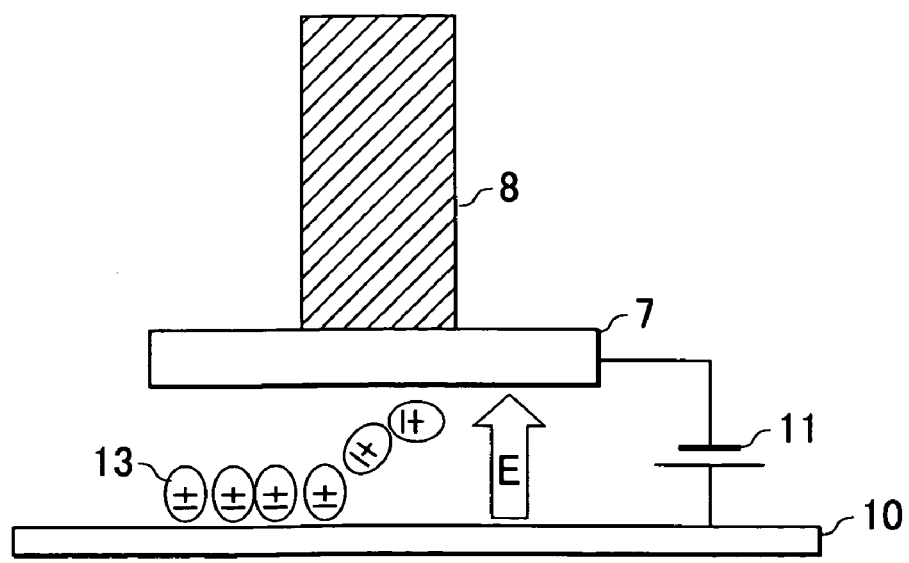
FIG. 2 is a conceptual diagram which illustrates the alignment of electric dipoles of ultra-fine particles by an electric field.

As conceptually shown in FIG. 2, by applying a potential difference between the substrate 10 and the nozzle tip 7, an electric field is generated in the space between the substrate 10 and the nozzle tip 7. The spontaneous polarizations of the ultra-fine particles which have been randomly oriented in the vicinity of the ejecting port are macroscopically oriented by the applied electric field, and thereby, a piezoelectric film having electric dipoles oriented in the direction of the electric field is thought to be formed. On the other hand, since the relative dielectric constant of the piezoelectric element in this example is lower than the value in manufacturer's catalog (relative dielectric constant: 1,400), presumably, the density of the piezoelectric element is lower or the degree of orientation of electric dipoles is smaller compared with the values listed in the catalog.

When polarization treatment is carried out after the film is formed by the gas deposition technique, strain is caused by the polarization, and the film and the substrate on which the film is deposited are deformed. In contrast, when the method of the present invention is employed, the substrate is not substantially deformed except for submicroscopic deformations due to the impact during film deposition.

When the substrate is composed of a resin, a metal layer of Ni, Al, Pt, or the like may be formed on the resin substrate by plating, sputtering, or the like. By setting the metal layer at ground potential, a voltage is applied to form an electric field, and a piezoelectric film is formed as in the example described above.

In this example, the electric potential of the nozzle tip 7 is set lower than the electric potential of the substrate 10. Of course, it is also possible to set the electric potential of the nozzle tip 7 higher than the electric potential of the substrate 10 by applying a voltage in the reverse direction. In such a case, the electric dipoles are oriented in a direction opposite to that in the example described above.

If a discharge occurs when the ultra-fine particles are ejected from the nozzle, there may be a possibility that PZT constituting the ultra-fine particles or the piezoelectric film are decomposed to precipitate Pb, Ti, etc., and the resultant piezoelectric film becomes conductive. In order to prevent the discharge, preferably, a current-limiting circuit is provided. The current-limiting circuit may be provided on the external power 11 or on the interconnection between the external power 11 and the substrate 10 or the nozzle tip 7. In this example, a resistor (not shown in the drawing) of 1 MΩ was disposed in series with the wiring to prevent a rush current from flowing. In order to prevent a discharge from occurring when powder generated due to abrasion of the transport pipe 4 is mixed into the ultra-fine particles, the insides of the ultra-fine particle-floating chamber 1 and the transport pipe 4 are preferably composed of nonconductors.

In this example, the voltage is applied between the nozzle tip 7 and the substrate 10. Alternatively, an electrode may be provided in the vicinity of the nozzle 6, and by applying a voltage to the electrode, an electric field may be generated in the space between the vicinity of the nozzle tip 7 and the substrate 10.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for making a piezoelectric element comprising a piezoelectric film formed on a substrate by a gas deposition technique, the method comprising the steps of:
    ejecting ultra-fine particles of a piezoelectric material having a perovskite structure from an ejecting device toward the substrate; and
    applying a potential difference (a) between the ejecting device and the substrate or (b) between an electrode in the vicinity of the ejecting device and the substrate, to apply an electric field to the ultra-fine particles traveling to the substrate sufficient to polarize and macroscopically orient the particles to form a deposited film with dipoles oriented in the direction of the electric field, wherein the potential difference is provided by an external power source and a current-limiting circuit is provided on the external power source or between the external power source and the ejecting device to prevent flow of excess current and eliminate electrical discharge when the ultra-fine particles are ejected.

2. A method for making a piezoelectric element according to claim 1, wherein the electric field applied has an intensity in the range of 0.5 to 3 kV/mm.

3. A method for making a piezoelectric element according to claim 2, wherein the electric field applied has an intensity in the range of 1 to 2 kV/mm.

4. A method for making a piezoelectric element according to claim 1, wherein the substrate comprises a metal.

5. A method for making a piezoelectric element according to claim 1, wherein the substrate comprises a resin.

* * * * *